(12) United States Patent
Sun

(10) Patent No.: US 9,330,941 B2
(45) Date of Patent: May 3, 2016

(54) PACKAGE CARRIER AND MANUFACTURING METHOD THEREOF

(75) Inventor: Shih-Hao Sun, Hsinchu County (TW)

(73) Assignee: Subtron Technology Co., Ltd., Hsinchu County (TW)

(*) Notice: Subject to any disclaimer, the term of this patent is extended or adjusted under 35 U.S.C. 154(b) by 548 days.

(21) Appl. No.: 13/469,079

(22) Filed: May 10, 2012

(65) Prior Publication Data

US 2013/0170148 A1  Jul. 4, 2013

(30) Foreign Application Priority Data

Dec. 30, 2011  (TW) .............................. 100149852 A

(51) Int. Cl.
*H05K 3/34* (2006.01)
*H01L 21/48* (2006.01)
(Continued)

(52) U.S. Cl.
CPC .......... *H01L 21/486* (2013.01); *H01L 21/6835* (2013.01); *H01L 23/49827* (2013.01); *H01L 24/32* (2013.01); *H01L 24/48* (2013.01); *H01L 2221/68345* (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01); *H01L 2224/83439* (2013.01);
(Continued)

(58) Field of Classification Search
CPC ........................ Y10T 29/49144; H01L 21/486
USPC .................... 29/846, 847, 852, 832, 834, 840
See application file for complete search history.

(56) References Cited

U.S. PATENT DOCUMENTS 5,072,520 A * 12/1991 Nelson .............. H01L 23/49816
                                                                134/1.1
8,188,380 B2 * 5/2012 Kawai .................... H05K 1/113
                                                                174/254
(Continued)

FOREIGN PATENT DOCUMENTS

JP       10-084186       3/1998
JP       2003-092460     3/2003
(Continued)

OTHER PUBLICATIONS

"Office Action of Japan Counterpart Application", issued on Jun. 17, 2014, p. 1-p. 4.
(Continued)

*Primary Examiner* — Peter DungBa Vo
*Assistant Examiner* — Kaying Kue
(74) *Attorney, Agent, or Firm* — Jianq Chyun IP Office

(57) ABSTRACT

A manufacturing method of a package carrier is provided. A supporting board having an upper surface which a patterned circuit layer formed thereon is provided. A portion of the upper surface is exposed by the patterned circuit layer. An insulating layer and a conducting layer located at a first surface of the insulating layer are laminated onto the patterned circuit layer. The patterned circuit layer and the exposed portion of the upper surface are covered by the insulating layer. Plural conductive connection structures are formed on the patterned circuit layer. Plural of pads respectively connecting the conductive connection structures and exposing a portion of the first surface of the insulating layer is defined by patterning the conductive layer. The supporting board is removed so as to expose a second surface of the insulating layer. The second surface and a bonding surface of the patterned circuit layer are coplanar.

4 Claims, 6 Drawing Sheets

(51) Int. Cl.
*H01L 23/498* (2006.01)
*H01L 21/683* (2006.01)
*H01L 23/00* (2006.01)

(52) U.S. Cl.
CPC ............... *H01L 2224/83444* (2013.01); *H01L 2224/83455* (2013.01); *H01L 2924/12041* (2013.01); *H01L 2924/12042* (2013.01); *H01L 2924/15311* (2013.01); *Y10T 156/10* (2015.01)

(56) References Cited

U.S. PATENT DOCUMENTS

| | | | | |
|---|---|---|---|---|
| 8,418,360 | B2* | 4/2013 | Kawai | H05K 1/113 29/825 |
| 8,859,912 | B2* | 10/2014 | Tseng | H05K 1/111 174/262 |
| 2002/0145203 | A1* | 10/2002 | Adae-Amoakoh | H01L 21/4857 257/778 |
| 2007/0292988 | A1* | 12/2007 | Nakabayashi | H01L 21/4846 438/108 |
| 2008/0142254 | A1* | 6/2008 | Wang | H01L 21/4857 174/259 |
| 2008/0298038 | A1* | 12/2008 | Kaneko | H01L 23/49811 361/808 |
| 2009/0073670 | A1* | 3/2009 | Hong | H05K 1/0271 361/792 |
| 2009/0084585 | A1* | 4/2009 | Matsumoto | H01L 23/13 174/255 |
| 2009/0294027 | A1* | 12/2009 | Wang | H01L 21/4857 156/150 |
| 2010/0206621 | A1* | 8/2010 | Wada | H05K 1/186 174/256 |
| 2011/0240351 | A1* | 10/2011 | Wakita | H05K 3/4644 174/258 |
| 2013/0097856 | A1* | 4/2013 | Kaneko | H01L 23/49811 29/847 |

FOREIGN PATENT DOCUMENTS

| | | |
|---|---|---|
| JP | 2005-044899 | 2/2005 |
| JP | 2009267274 | 11/2009 |
| JP | 2011-114121 | 6/2011 |
| TW | 201108905 | 3/2011 |
| TW | 201142958 | 12/2011 |
| WO | 2008001915 | 1/2008 |
| WO | 2011138949 | 11/2011 |

OTHER PUBLICATIONS

"Office Action of Taiwan Counterpart Application", issued on Jul. 22, 2014, p. 1-p. 6.

"Office Action of Japan Counterpart Application", issued on Feb. 25, 2014, p. 1-p. 3.

* cited by examiner

PACKAGE CARRIER AND MANUFACTURING METHOD THEREOF

CROSS-REFERENCE TO RELATED APPLICATION

This application claims the priority benefit of Taiwan application serial no. 100149852, filed on Dec. 30, 2011. The entirety of the above-mentioned patent application is hereby incorporated by reference herein and made a part of this specification.

BACKGROUND OF THE INVENTION

1. Field of the Invention

The present invention generally relates to a package structure and a manufacturing method thereof, more particularly, relates to a package carrier and a manufacturing method thereof.

2. Description of Related Art

A chip package aims at protecting an exposed chip, lowering the density of chip contacts, and effectively dissipating heat generated by the chip. A common way to package the chip is to configure the chip to a package carrier by performing a wire-bonding process or a flip-chip bonding process, such that contacts on the chip can be electrically connected to the package carrier. Therefore, the contacts on the chip can be re-distributed through the package carrier, so as to comply with contact distribution of external devices of next hierarchy.

Generally, in order to form the package carrier, a core dielectric layer often serves as a core material, and patterned circuit layers and patterned dielectric layers are alternately stacked on the core dielectric layer by performing a fully additive process, a semi-additive process, a subtractive process, or any other process. Consequently, the core dielectric layer accounts for a great proportion of the whole thickness of the package carrier. If the thickness of the core dielectric layer cannot be effectively reduced, it will be very difficult to reduce the thickness of the chip package.

SUMMARY OF THE INVENTION

Accordingly, the invention is directed to a package carrier suitable for carrying at least one chip.

The invention is further directed to a manufacturing method of a package carrier. By applying the manufacturing method, the aforesaid package carrier can be formed.

In an embodiment of the invention, a manufacturing method of a package carrier is provided. In the manufacturing method, a supporting board having an upper surface is provided. A patterned circuit layer is formed on the upper surface of the supporting board. A portion of the upper surface of the supporting board is exposed by the patterned circuit layer. An insulating layer and a conducting layer located at a first surface of the insulating layer are laminated onto the patterned circuit layer, wherein the insulating layer covers the patterned circuit layer and the portion of the upper surface of the supporting board exposed by the patterned circuit layer. A plurality of conductive connection structures are formed on the patterned circuit layer. The conductive layer is patterned to define a plurality of pads respectively connected to the conductive connection structures and to expose a portion of the first surface of the insulating layer. A second surface opposite to the first surface of the insulating surface is exposed by removing the supporting board, wherein the second surface of the insulating layer and the a bonding surface of the patterned circuit layer are coplanar.

In an embodiment of the invention, a package carrier suitable for carrying at least one chip is provided. The package carrier includes an insulating layer, a patterned circuit layer, a plurality of conductive connection structures and a plurality of pads. The insulating layer has a first surface and a second surface opposite to each other. The patterned circuit layer is embedded in the second surface of the insulating layer and has a bonding surface. The second surface of the insulating layer and the bonding surface of the patterned circuit layer are coplanar, and the chip is disposed on the patterned circuit layer. The conductive connection structures are embedded in the insulating layer and connected to the patterned circuit layer. The pads are disposed on the first surface of the insulating layer and connected to the conductive connection structures respectively.

Based on the above-mentioned, in the present invention, the supporting board is served as a supporting structure at first, and then the patterned circuit layer, the insulating layer, the conductive connection structures and the pads are formed on the supporting board, and the fabrication of the package carrier is completed after removing the supporting board. Therefore, in comparison with the conventional package structure that has the core dielectric layer, the package carrier of the present invention can have a relatively small thickness. Furthermore, in the present invention, since the patterned circuit layer is embedded in the insulating layer, the package structure formed by disposing the chip on the patterned circuit layer can have a relatively small thickness.

In order to the make the aforementioned and other objects, features and advantages of the present invention comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the disclosure and, together with the description, serve to explain the principles of the invention.

DESCRIPTION OF EMBODIMENTS

Figure 1A:
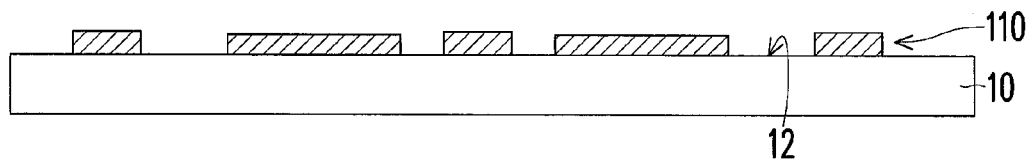
FIG. 1A to FIG. 1E are schematic cross-sectional views illustrating a manufacturing method of a package carrier according to an embodiment of the invention.

FIG. 1A to FIG. 1E are schematic cross-sectional views illustrating a manufacturing method of a package carrier according to an embodiments of the invention. With reference to FIG. 1A, according to the manufacturing method of the package carrier in this embodiment, a supporting board 10 having a upper surface 12 is provided. Thenafter, a patterned circuit layer 110 is formed on the upper surface 12, wherein the patterned circuit layer 110 exposes a portion on of the upper surface 12 of the supporting board 10, a line width of the patterned circuit layer 110 is between 15 micrometers and 35 micrometers and the line pitch of the patterned circuit layer 110 is at least greater than 15 micrometers. Namely, the patterned circuit layer 110 here can be deemed as a fine circuit layer.

It should be noted that, in the present embodiment, electroplating is used to form the patterned circuit layer 110, in which an electroplating seed layer (not shown) is needed to be formed on the supporting board 10 in advance and then the electroplating seed layer serves as an electrode to form the patterned circuit layer 110 by electroplating. Therefore, the material of the supporting board 10 can be insulating material or metal material.

Figure 1B:
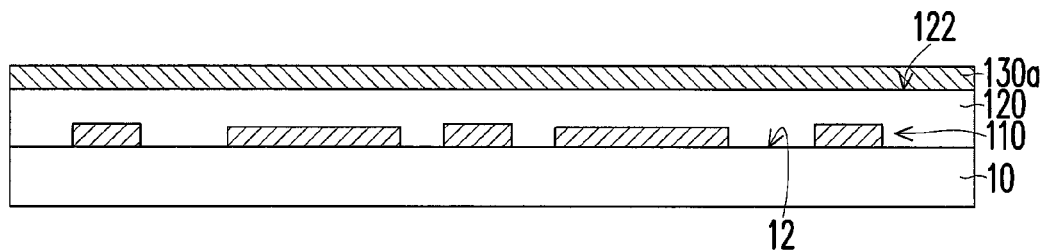

With reference to FIG. 1B(a), an insulating layer 120 and a conductive layer 130a located at a first surface 122 of the insulating layer 120 are laminated onto the patterned circuit layer 110. Herein, the insulating layer 120 covers the patterned circuit layer 110 and the portion of the upper surface 12 of the supporting board 10 exposed by the patterned circuit layer 110.

Figure 1C:
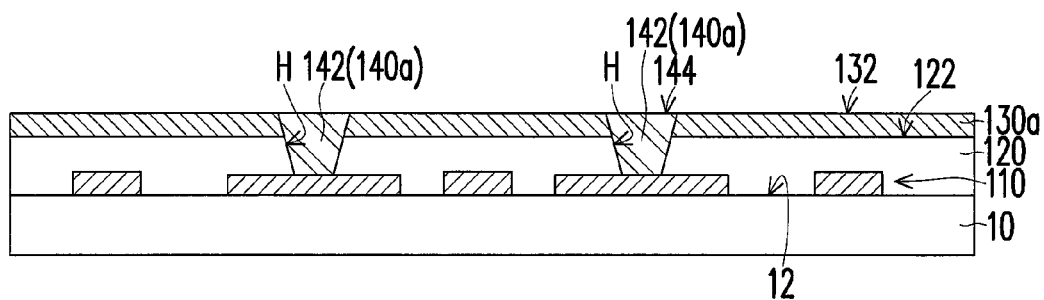
Figure 1B:
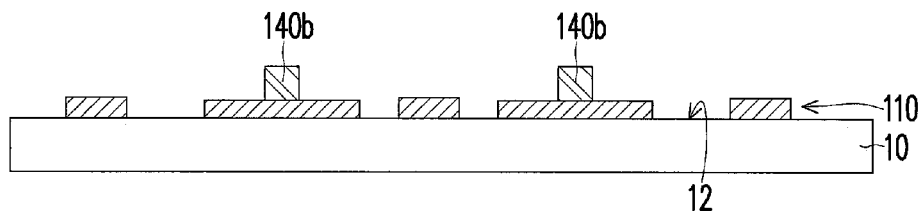
Figure 1C:
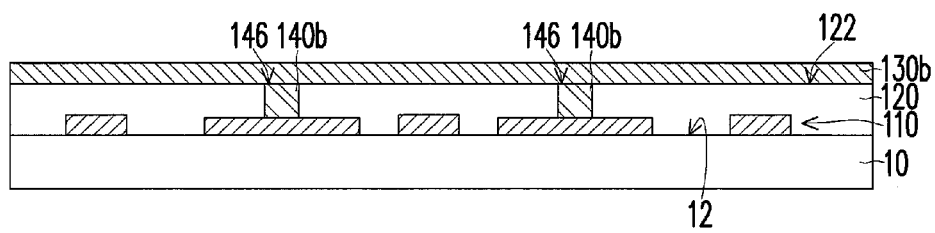

With reference to FIG. 1C(a), the conductive layer 130a is irradiated by a laser beam (not shown) to form a plurality of blind vias H extending from the conductive layer 130a to the patterned circuit layer 110. Then, a conductive material 142 is filled into the blind vias H to form a plurality of conductive connection structures 140a. Herein, the conductive connection structures 140a connect to the conductive layer 130a and patterned circuit layer 110. A bottom surface 144 of each conductive connection structure 140a and a bottom surface 132 of the conductive layer 130a are substantially coplanar.

While it is illustrated in this embodiment that the insulating layer 120 and the conductive layer 130a thereon are laminated on the patterned circuit layer 110 prior to the formation of the conducive connection structures 140a, and the conductive connection structure 140a is a conductive blind via connection structure, it is noted that the present invention is not intended to limit the sequence of laminating the insulating layer 120 and the conductive layer 130a thereon and forming the conductive connection structure 140a, and not intended to limit the conductive connection structure 140a to the particular configuration. In another embodiment, With reference to FIG. 1B(b), the conductive connection structures 140b can be formed on the patterned circuit layer 110 in advance and then, with reference to FIG. 1C(b), the insulating layer 120 and the conductive layer 130b thereon are laminated onto the patterned circuit layer 110. Herein, the conductive connection structures 140b penetrate through the insulating layer 120 and are connected to the conductive layer 130b, herein a surface 146 of each of the conductive connection structures 140b and the first surface 122 of the insulating layer are substantially coplanar, and the conductive connection structures 140b are embodied as conductive columns. Furthermore, the insulating layer 120 covers the conductive connection structures 140, and the insulating layer 120 is located between the conductive layer 130b and the patterned circuit layer 110. These steps mentioned above remain the solutions in the present invention and they are in the claimed scope of the present invention.

Figure 1D:
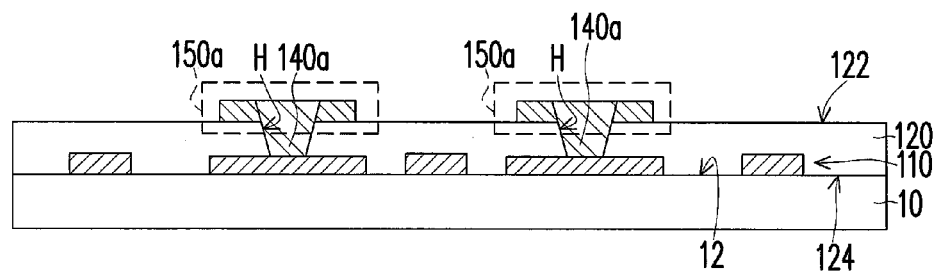

Following the process illustrated in FIG. 1C(a), with reference to FIG. 1D, the above-mentioned conductive layer 130a is patterned to define a plurality of pads 150a respectively connected to the conductive connection structures 140a and expose a portion of the first surface 122 of the insulating layer 120.

Figure 1E:
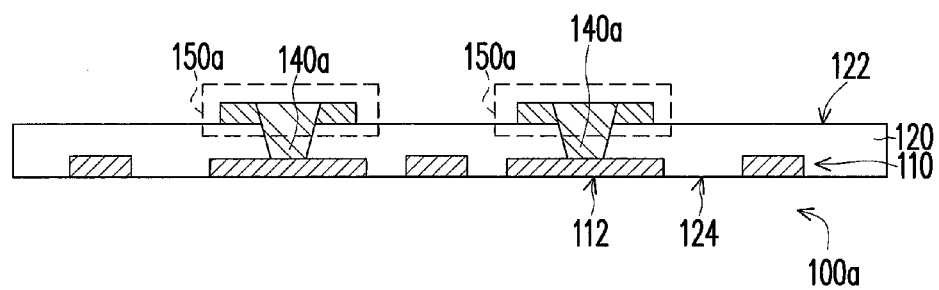

Finally, with reference to FIG. 1D and FIG. 1E together, a second surface 124 of the insulating layer 120 opposite to the first surface 122 is exposed by removing the supporting board 10, herein the second surface 124 of the insulating layer 120 and a bonding surface 112 of the patterned circuit layer 110 are substantially coplanar. So far, the fabrication of the package carrier 100a is substantially completed.

As indicated in FIG. 1E, the package carrier 100a in the present embodiment includes the patterned circuit layer 110, the insulating layer 120, the conductive connection structures 140a and pads 150a. The insulating layer 120 has the first surface 122 and the second surface 124 opposite to each other. The patterned circuit layer 110 is embedded in the second surface 124 of the insulating layer 120 and has the bonding surface 112. The second surface 124 of the insulating layer 120 and the bonding surface 112 of the patterned circuit layer 110 are substantially coplanar. The conductive connection structures 140a are embedded in the insulating layer 120 and are connected to the patterned circuit layer 110. The pads 150a are disposed on the first surface 122 of the insulating layer 120 and respectively connected to the conductive connection structures 140a.

In the present embodiment, the supporting board 10 is served as a supporting structure at first, and then the patterned circuit layer 110, the insulating layer 120, the conductive connection structures 140a and the pads 150a are formed on the supporting board 10, and the fabrication of the package carrier 100a is completed after removing the supporting board 10. Hence, in comparison with the conventional package structure that has the core dielectric layer, the package carrier 100a in the present embodiment has no need to the thickness of the supporting structure (i.e. supporting board 10 or conventional core dielectric layer) and has a relatively small thickness. Furthermore, since the patterned circuit layer 110 of the package carrier 100a is embedded in the insulating layer 120, the package structure formed by disposing a chip (not shown) on the patterned circuit layer 110 of the package carrier 100a can have a relative small thickness, and it matches the demand for a slimmer body.

While it is illustrated in this embodiment that each of the insulating layer 120, the conductive layer 130a (or 130b) and the conductive connection structures 140a (140b) comprises one single layer, it is noted that the present invention is not intended to limit the number of the insulating layer 120, the conductive layer 130a (or 130b) and the conductive connection structures 140a (140b). In other embodiments that are not illustrated, the aforementioned processes including FIG. 1B(a), FIG. 1C(a), FIG. 1B(b) and FIG. 1C(b) can also be used, and those with ordinary skill in the art can refer the descriptions of the aforementioned embodiment to repeat the aforementioned processes according to an actual demand, so as to achieve a required technical effect.

It should noted that the following embodiments follow the reference numbers and parts of the contents of the aforementioned embodiments, in which the same reference numbers indicate the same or similar components, and the description of the same technology contents is omitted. Omitted parts of the description can refer to the aforementioned embodiments and are not repeated in the following embodiments.

Figure 1F:
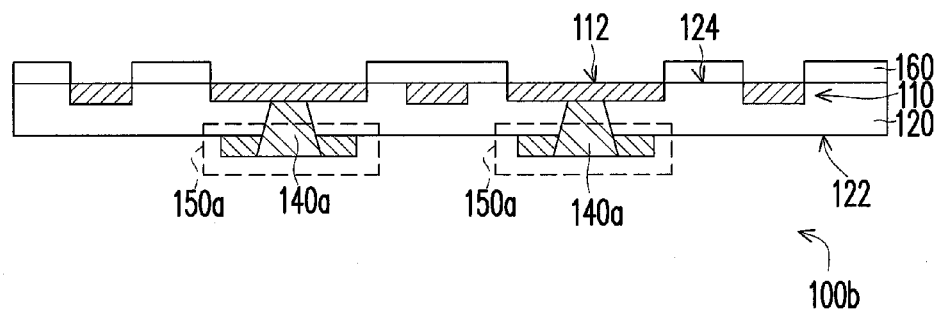
FIG. 1F is a schematic cross-sectional view illustrating a package carrier according to an embodiment of the invention.

FIG. 1F is a schematic cross-sectional view illustrating a package carrier according to an embodiment of the invention. With reference to FIG. 1F, the package carrier 100b of the embodiment is similar to the package carrier 100a of FIG. 1E, except that the package carrier 100b of embodiment further includes a solder resist layer 160, herein the solder resist layer 160 is disposed on the second surface 124 of the insulating layer 120, and a portion of the bonding surface 112 of the patterned circuit layer 110 is exposed by the solder resist layer 160.

A manufacturing method of the package carrier 100b of the present embodiment is approximately the same to that of the package carrier 100a of the aforementioned embodiment, and after the process disclosed in FIG. 1E, i.e. after removing the supporting board 10, a solder resist layer 160 is formed on the second surface 124 of the insulating layer 120. Herein, a portion of the bonding surface 112 of the patterned circuit layer 110 exposed by the solder resist layer 160 can serve as the bonding position of chip (not shown) and the bonding wire (not shown) for a successive process. So far, the fabrication of the package carrier 100b is completed.

Figure 1G:
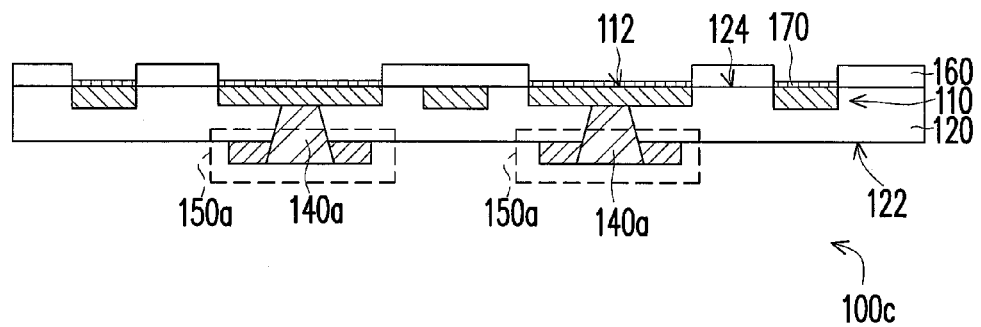
FIG. 1G is a schematic cross-sectional view illustrating a package carrier according to another embodiment of the invention.

FIG. 1G is a schematic cross-sectional view illustrating a package carrier according to another embodiment of the invention. With reference to FIG. 1G, the package carrier 100c of the embodiment is similar with the package carrier 100b of FIG. 1F, except that the package carrier 100c of embodiment further includes a surface treatment layer 170, herein the surface treatment layer 170 is disposed on the bonding surface 112 of the patterned circuit layer 110, and the material of the surface treatment layer 170 includes gold, silver, nickel/gold alloy, nickel/palladium/gold alloy, nickel/silver alloy or other suitable material materials.

A manufacturing method of the package carrier 100c of the present embodiment is approximately the same to that of the package carrier 100b of the aforementioned embodiment, and after the process disclosed in FIG. 1F, i.e. after forming the solder resist layer 160, a surface treatment layer 170 is formed on the bonding surface 112 of the patterned circuit layer 110 that is not covered by the solder resist layer 160 to prevent the effect of oxidation on the patterned circuit layer 110 and affect the bonding reliability in the subsequent chip (not shown) and the bonding wire (not shown). So far, the fabrication of the package carrier 100c is completed.

Figure 1H:
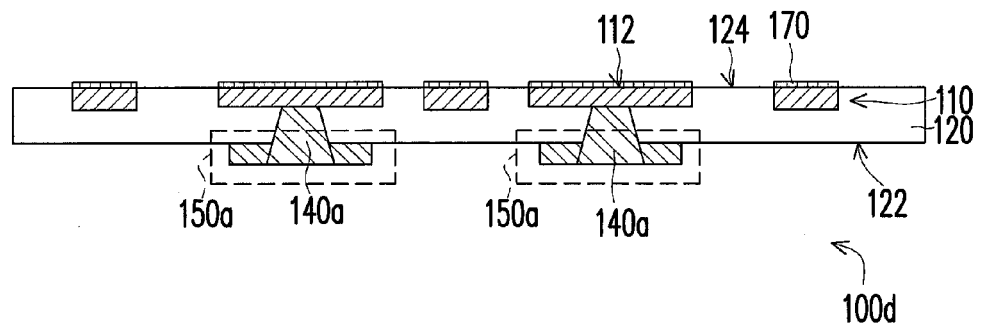
FIG. 1H is a schematic cross-sectional view illustrating a package carrier according to another embodiment of the invention.

FIG. 1H is a schematic cross-sectional view illustrating a package carrier according to another embodiment of the invention. With reference to FIG. 1H, the package carrier 100d of the embodiment is similar with the package carrier 100a of FIG. 1E, except that the package carrier 100d of embodiment further includes a surface treatment layer 170, herein the surface treatment layer 170 is disposed on the bonding surface 112 of the patterned circuit layer 110, and the material of the surface treatment layer 170 includes gold, silver, nickel/gold alloy, nickel/palladium/gold alloy, nickel/silver alloy or other suitable material materials.

A manufacturing method of the package carrier 100d of the present embodiment is approximately the same to that of the package carrier 100a of the aforementioned embodiment, and after the process disclosed in FIG. 1E, i.e. after removing the supporting board 10, a surface treatment layer 170 is formed on the bonding surface 112 of the patterned circuit layer 110 to prevent the effect of oxidation on the patterned circuit layer 110 and affect the bonding reliability in the subsequent chip (not shown) and the bonding wire (not shown). So far, the fabrication of the package carrier 100d is completed.

Figure 2A:
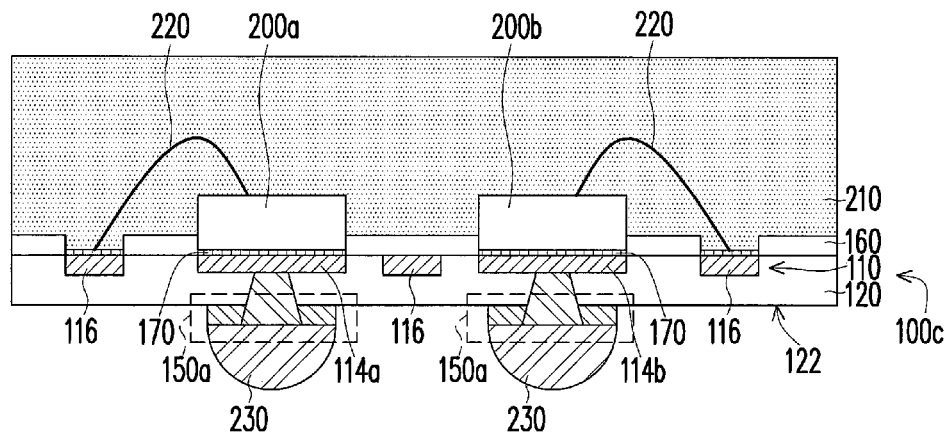
FIG. 2A is a schematic cross-sectional view illustrating that a package carrier carries a plurality of chips according to an embodiment of the invention.

FIG. 2A is a schematic cross-sectional view illustrating that a package carrier carries a plurality of chips according to an embodiment of the invention. With reference to FIG. 2A, the package carrier 100c of the embodiment is suitable for carrying at least one chip (two chips 200a and 200b are shown in FIG. 2A). Herein, the chips 200a and 200b are disposed on the surface treatment layer 170 above the patterned circuit layer 110, and the chips 200a and 200b, for example, is an integrated circuit chip such as a chip module or an individual chip that includes a graphic chip and a memory chip, or a photoelectric chip such as an LED chip or a laser diode chip, which should not be construed as a limitation to the invention.

Specifically, the patterned circuit layer 110 of the embodiment includes at least a die pad (two die pads 114a and 114b are shown in FIG. 2A) and a plurality of bonding pads 116 (two of them are shown in FIG. 2A). Herein, the chip 200a and 200b are disposed respectively on the die pads 114a and 114b, and the chip 200a and 200b are connected to the bonding pads 116 respectively via at least one bonding wires 220. Portion regions of the chip 200a and 200b are embedded in a spaces formed by solder resist layers 160 and surface treatment layers 170. Furthermore, in this embodiment, the chips 200a and 200b, bonding wires 220 and a portion of the package carrier 100c can be encapsulated by a molding compound 210, so as to secure the electrical connection among the chip 200a and 200b, the bonding wires 220, and the package carrier 100c. In addition, in this embodiment, the package carrier 100c can also be electrically connected to the external circuit (not shown) via a plurality of solder balls 230 soldered on the pads 150a.

Figure 2B:
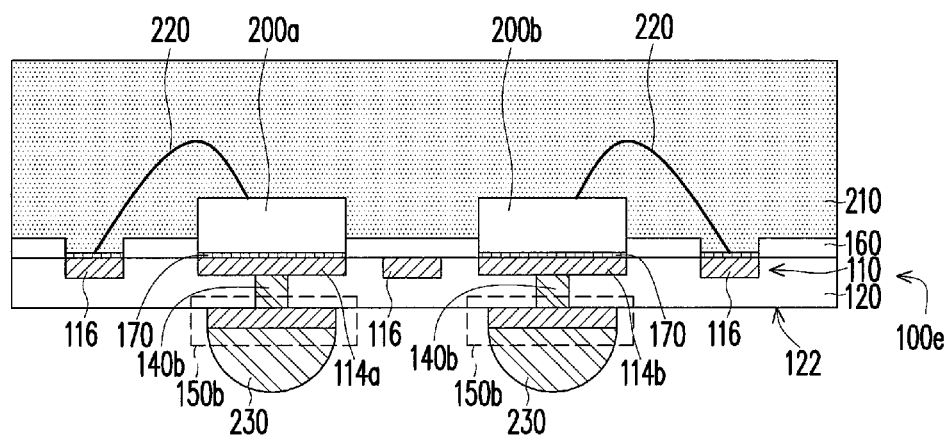
FIG. 2B is a schematic cross-sectional view illustrating that a package carrier carries a plurality of chips according to another embodiment of the invention.
Figure 2C:
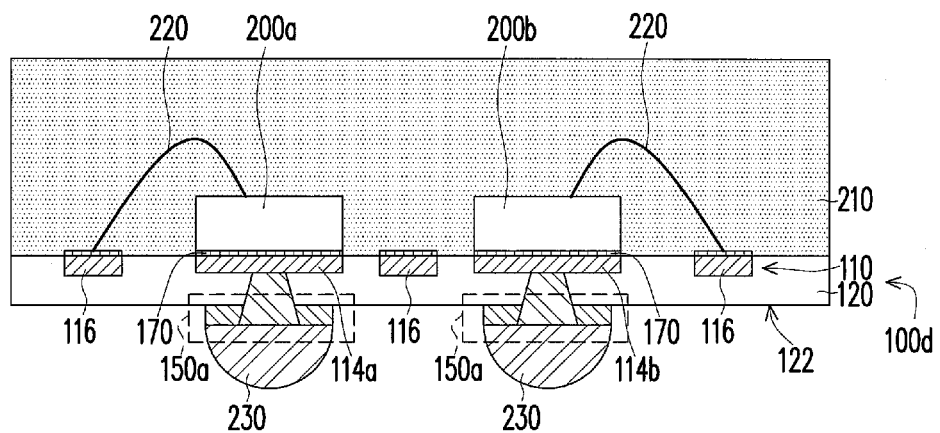
FIG. 2C is a schematic cross-sectional view illustrating that a package carrier carries a plurality of chips according to another embodiment of the invention.
Figure 2D:
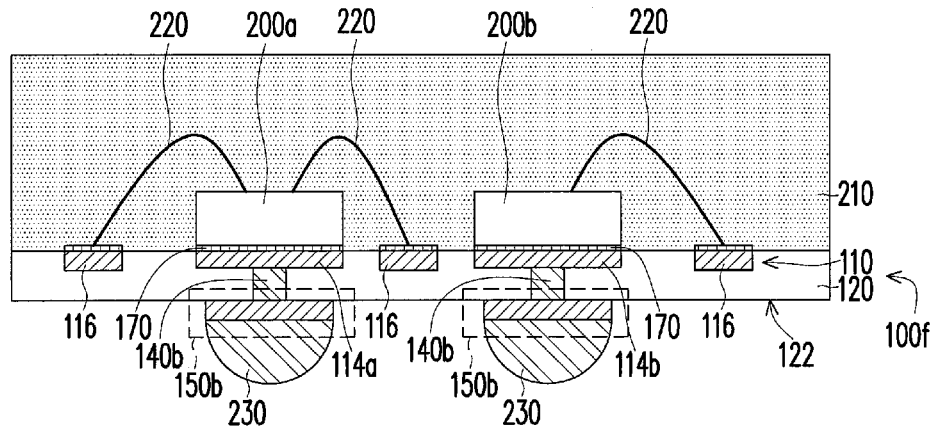
FIG. 2D is a schematic cross-sectional view illustrating that a package carrier carries a plurality of chips according to another embodiment of the invention.

Note that, in other embodiments, with reference to FIG. 2B, the chips 200a and 200b can also be disposed on a package carrier 100e having the conductive connection structures 140b in the form of conductive columns. Herein, the pads 150b are formed by patterning the conductive layer 130b (referring to FIG. 1C(b)). Alternatively, with reference to FIG. 2C, the chips 200a and 200b can also be disposed on a package carrier 100d in which the patterned circuit layer 110 has three bonding pads 116. Alternatively, with reference to FIG. 2D, the chips 200a and 200b can also be disposed on a package carrier 100f electrically connected to the bonding pads 116 via bonding wires 220. Herein, the package carrier 100f is similar with the package carrier 100a in FIG. 1E, except that the package carrier 100f has the conductive connection structures 140b in the form of conductive columns and the surface treatment layer 170 disposed on the bonding surface 112 of the patterned circuit layer 110, in which the pads 150b are formed by patterning the conductive layer 130b (referring to FIG. 1C(b)).

In addition, in other embodiment that are not illustrated, the aforementioned the package carrier 100a and 100b can be used, and those with ordinary skill in the art can refer the descriptions of the aforementioned embodiment to dispose the chip 200a and 200b on the selecting aforementioned elements according to an actual demand, so as to achieve a required technical effect.

In summary, in the present invention, the supporting board is served as a supporting structure at first, and then the patterned circuit layer, the insulating layer, the conductive connection structures and the pads are formed on the supporting board, and the fabrication of the package carrier is completed after removing the supporting board. Therefore, in comparison with the conventional package structure that has the core dielectric layer, the package carrier of the present invention can have a relatively small thickness. Furthermore, in the present invention, since the patterned circuit layer is embedded in the insulating layer, the package structure formed by disposing the chip on the patterned circuit layer can have a relatively small thickness.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package carrier, comprising:

providing a supporting board having an upper surface;

forming a patterned circuit layer directly on the upper surface of the supporting board, wherein the patterned circuit layer exposes a portion of the upper surface of the supporting board, and the patterned circuit layer comprises at least one die pad;

laminating an insulating layer and a conductive layer located at a first surface of the insulating layer directly onto the patterned circuit layer, wherein the insulating layer covers the patterned circuit layer and the portion of the upper surface of the supporting board exposed by the patterned circuit layer;

forming a plurality of conductive connection structures directly on the patterned circuit layer;

patterning the conductive layer to define a plurality of pads respectively connected to the conductive connection structures and to expose a portion of the first surface of the insulating layer;

removing the supporting board to expose a second surface opposite to the first surface of the insulating layer, wherein the second surface of the insulating layer and a bonding surface of the patterned circuit layer are coplanar;

forming a solder resist layer directly on the second surface of the insulating layer after removing the supporting board, wherein a portion of the bonding surface of the patterned circuit layer is exposed by the solder resist layer; and forming a surface treatment layer directly on the bonding surface of the patterned circuit layer after removing the supporting board, wherein a portion of the surface treatment layer is located between a chip and the die pad, a height difference is between a first top surface of the solder resist layer and a second top surface of the surface treatment layer so as to form a cavity between a sidewall of the solder resist layer and the second top surface of the surface treatment layer, and portions of the chip is embedded in the cavity formed by the solder resist layer and surface treatment layer, and a bottom surface of the chip is lower than the first top surface of the solder resist layer.

2. The manufacturing method of the package carrier as recited in claim 1, wherein the step of forming the conductive connection structures on the patterned circuit layer is performed after the step of laminating the insulating layer and the conductive layer located thereon onto the patterned circuit layer, and the step of forming the conductive connection structures on the patterned circuit layer comprise:

irradiating the conductive layer with a laser beam to form a plurality of blind vias extending from the conductive layer to the patterned circuit layer; and filling a conductive material into the blind vias to form the conductive connection structures, wherein the conductive connection structures connects the conductive payer and the patterned circuit layer, and a bottom surface of each of the conductive connection structures and a bottom surface of the conductive layer are coplanar.

3. The manufacturing method of the package carrier as recited in claim 1, wherein the step of forming the conductive connection structures on the patterned circuit layer is performed before the step of laminating the insulating layer and the conductive layer located thereon onto the patterned circuit layer, and after the insulating layer and the conductive layer located thereon are laminated on the patterned circuit layer, the insulating layer covers the conductive connection structures, and the conductive connection structures are located between the conductive layer and patterned circuit layer.

4. The manufacturing method of the package carrier as recited in claim 1, wherein a material of the surface treatment layer comprises gold, silver, nickel/gold alloy, nickel/palladium/gold alloy or nickel/silver alloy.

* * * * *